(12) United States Patent
Shichijo et al.

(10) Patent No.: US 10,367,129 B2
(45) Date of Patent: Jul. 30, 2019

(54) LIGHT EMITTING DEVICE

(71) Applicant: NICHIA CORPORATION, Anan-shi, Tokushima (JP)

(72) Inventors: Satoshi Shichijo, Itano-gun (JP); Kunihito Sugimoto, Anan (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 0 days.

(21) Appl. No.: 15/620,730

(22) Filed: Jun. 12, 2017

(65) Prior Publication Data

US 2017/0358724 A1 Dec. 14, 2017

(30) Foreign Application Priority Data

Jun. 14, 2016 (JP) .................................. 2016-118337

(51) Int. Cl.
| | |
|---|---|
| *H01L 25/16* | (2006.01) |
| *H01L 27/15* | (2006.01) |
| *H01L 33/48* | (2010.01) |
| *H01L 33/50* | (2010.01) |
| *H01L 33/60* | (2010.01) |

(Continued)

(52) U.S. Cl.
CPC .......... *H01L 33/62* (2013.01); *H01L 25/0753* (2013.01); *H01L 27/156* (2013.01); *H01L 33/486* (2013.01); *H01L 33/502* (2013.01); *H01L 33/507* (2013.01); *H01L 33/60* (2013.01); *H01L 25/167* (2013.01)

(58) Field of Classification Search
CPC ....... H01L 33/20; H01L 33/505; H01L 33/60; H01L 2933/0041; H01L 33/62; H01L 33/647

See application file for complete search history.

(56) References Cited

U.S. PATENT DOCUMENTS

| | | | |
|---|---|---|---|
| 2005/0168992 A1* | 8/2005 | Hirose | H01L 33/405 362/296.04 |
| 2009/0020769 A1* | 1/2009 | Yoneda | H01L 33/382 257/88 |

(Continued)

FOREIGN PATENT DOCUMENTS

| | | |
|---|---|---|
| JP | 2003-209286 A | 7/2003 |
| JP | 2005-203448 A | 7/2005 |

(Continued)

*Primary Examiner* — Changhyun Yi
(74) *Attorney, Agent, or Firm* — Foley & Lardner LLP

(57) ABSTRACT

A light emitting device includes a mounting board including: a base part, and one or more wiring structures, each of which includes one or more first wiring parts, and one or more second wiring parts, in that order, from a base part side, wherein, in a plan view, an area of each of the one or more second wiring parts is smaller than an area of each of the one or more first wiring parts; one or more light emitting elements bonded to the second wiring parts via bonding members; and a reflective member covering at least a portion of the bonding members and at least a portion of the one or more wiring structures. A reflectance of the one or more first wiring parts is higher than a reflectance of the bonding members. The one or more second wiring parts and the bonding members comprise the same material at their outermost surfaces.

11 Claims, 11 Drawing Sheets

(51) Int. Cl.
*H01L 33/62* (2010.01)
*H01L 25/075* (2006.01)

(56) References Cited

U.S. PATENT DOCUMENTS

| | | | | |
|---|---|---|---|---|
| 2012/0104452 A1* | 5/2012 | Miyoshi | ............. | H01L 25/0753 |
| | | | | 257/99 |
| 2013/0188361 A1* | 7/2013 | Muramatsu | .......... | H05K 7/2039 |
| | | | | 362/296.01 |
| 2015/0262987 A1* | 9/2015 | Wada | .................... | H01L 33/505 |
| | | | | 257/98 |
| 2017/0098740 A1* | 4/2017 | Ohmae | .................. | H01L 33/40 |

FOREIGN PATENT DOCUMENTS

| | | | |
|---|---|---|---|
| JP | 2008-027933 | A | 2/2008 |
| JP | 2009-182307 | A | 8/2009 |
| JP | 2012-004303 | A | 1/2012 |
| JP | 2015-177120 | A | 10/2015 |
| WO | WO-2016/042788 | A1 | 3/2016 |
| WO | WO-2016/042800 | A1 | 3/2016 |

* cited by examiner

US 10,367,129 B2

LIGHT EMITTING DEVICE

CROSS-REFERENCE TO RELATED APPLICATION

This application claims priority to Japanese Patent Application No. 2016-118337, filed on Jun. 14, 2016, the disclosure of which is hereby incorporated by reference in its entirety.

BACKGROUND

The present disclosure relates to a light emitting device.

In recent years, light emitting diodes (LEDs) are utilized not only as light sources for lighting applications, taking over from fluorescent lamps, but also as light sources for headlights of vehicles and the like.

There is known a light emitting device which employs an LED in which one or more light emitting elements are mounted on a mounting board equipped with wiring.

For example, Japanese Unexamined Patent Application Publication No. 2015-177120 discloses a light emitting device having: a mounting board; light emitting elements mounted on the mounting board; phosphor layers each provided on the light emitting elements; and a reflective member disposed adjacent to the lateral faces of the phosphor layer and the lateral faces of the light emitting elements so as to cover the surface of the mounting board.

SUMMARY

Depending on the material and the thickness of the reflective member disposed between one or more light emitting elements and a mounting board, however, light from the light emitting elements can reach and is absorbed by the substrate surface, which can likely reduce the light extraction efficiency of the light emitting device.

An object of certain embodiments of the present disclosure is to provide a light emitting device with a higher light extraction efficiency.

A light emitting device according to an embodiment of the present disclosure includes a mounting board including: a base part, and one or more wiring structures, each of which includes one or more first wiring parts, and one or more second wiring parts, in that order, from a base part side, wherein, in a plan view, an area of each of the one or more second wiring parts is smaller than an area of each of the one or more first wiring parts; one or more light emitting elements bonded to the second wiring parts via bonding members; and a reflective member covering at least a portion of the bonding members and at least a portion of the one or more wiring structures. A reflectance of the one or more first wiring parts is higher than a reflectance of the bonding members. The one or more second wiring parts and the bonding members comprise the same material at their outermost surfaces.

DESCRIPTION OF THE EMBODIMENTS

Figure 1:
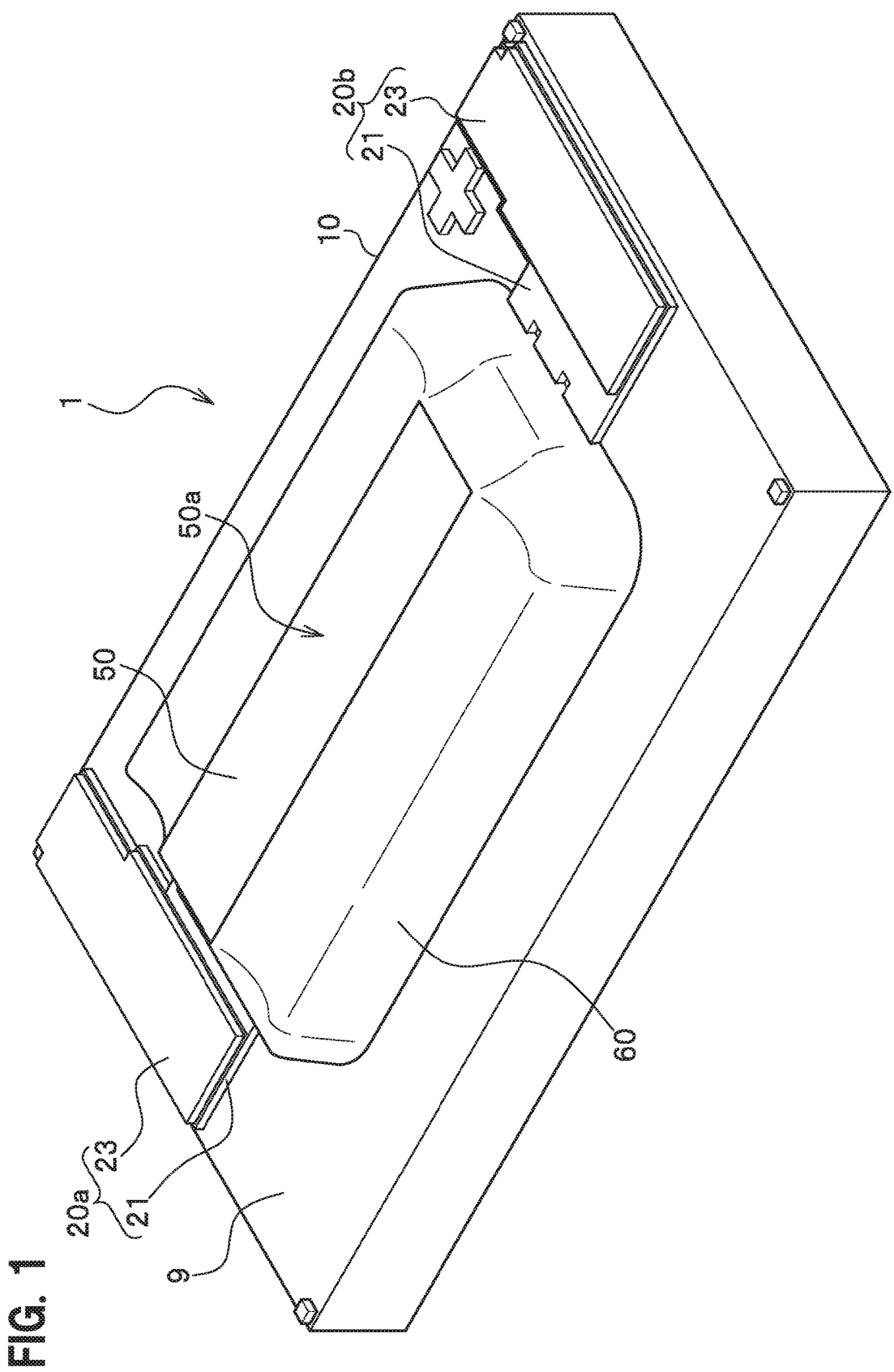
FIG. 1 is a schematic perspective view showing the configuration of the light emitting device according to an embodiment.
Figure 2:
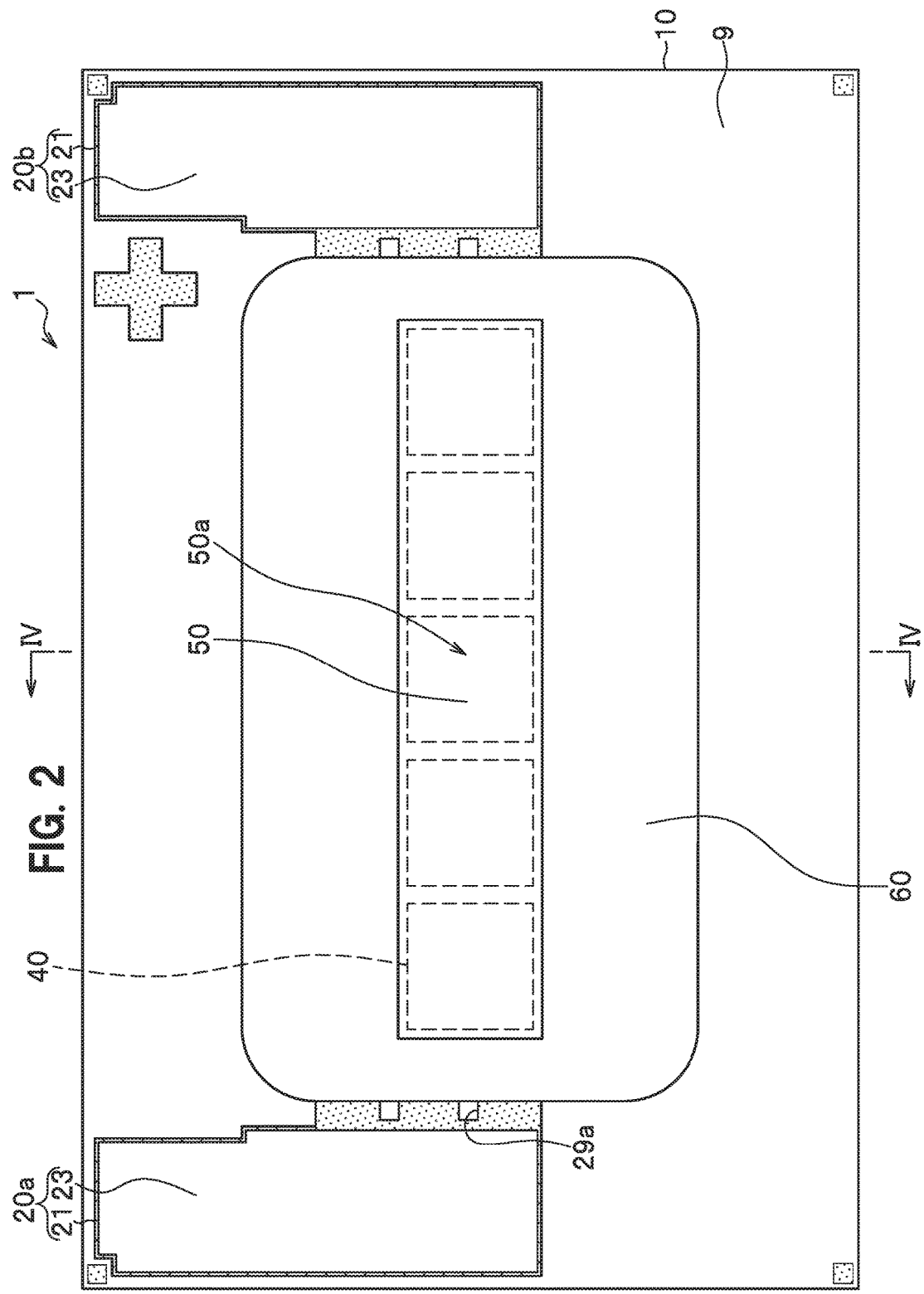
FIG. 2 is a schematic plan view showing the configuration of the light emitting device according to the embodiment.

Embodiments of the present disclosure will be described below with reference to the accompanying drawings. It should be appreciated, however, that the embodiments described below are illustrations of a light emitting device to give a concrete form to technical ideas of the present embodiments, and the technical scope of the present invention is not limited to those described below unless otherwise specifically noted. Furthermore, the sizes, positional relations, and so forth of the members shown in the drawings may be exaggerated for the sake of clarity.

Moreover, in the light emitting device according to the embodiments, terms indicating certain directions, such as "upper," "lower," "left," and "right" can be switched depending on the situation. These terms such as "upper" and "lower" are used herein to show the relative positions between the constituent elements in the drawings being referred to for the purpose of explanation, and are not intended to indicate the absolute positions of the constituent elements unless otherwise specifically noted.

First Embodiment

The Configuration of the Light Emitting Device

As shown in FIG. 1 to FIG. 4, the light emitting device 1 according to the first embodiment primarily includes: a mounting board 10 having a base part 9 and one or more wiring structures 20, each of which includes one or more first wiring parts 21 and one or more second wiring parts 22 each having a smaller area than that of each of the first wiring parts 21 in that order from base part 9 side; one or more light emitting elements 40 bonded to the second wiring parts 22 via bonding members 30; and a reflective member 60 covering at least a portion of the bonding members 30 and a portion of the wiring structures 20. The first wiring parts 21, moreover, have higher reflectance than that of the bonding members 30, and the second wiring parts 22 contain the same material as that of the bonding member 30 at each of outermost surfaces thereof. Each component will be explained below.

Mounting Board

The mounting board 10 includes a base part 9 and a wiring structure 20 arranged on the upper face of the base part 9.

Base Part Examples of the base part 9 include those configured with an insulation material, such as glass epoxy, resin, ceramic, and the like. A base part 9 employing a ceramic is preferable due to its highly heat resistant and highly weather resistant. Ceramic materials include alumina, aluminum nitride, mullite, and the like. The base part 9 may be one in which an insulation film is formed on the surface of a metal material. In the present embodiment, the base part 9 is formed in a rectangular shape in a plan view. Wiring Structures The wiring structures 20 have one or more first wiring parts 21 and one or more second wiring parts 22 provided from the base part 9 side in that order, and the area of the second wiring parts 22 in a plan view is smaller than that of the first wiring parts 21. In other words, the wiring structures 20 each include the second wiring parts 22 each having an island-shape on each of the first wiring parts 21. On the second wiring parts 22 each having an island-shape, one or more light emitting elements 40 discussed later are bonded via bonding members 30.

Because the reflectance of the first wiring parts 21 for light emitted from one or the light emitting elements 40 is higher than that of the bonding members 30, the light emitted from the light emitting elements 40 and travelling towards the mounting board 10 can be reflected towards the light emitting elements 40.

Because the second wiring parts 22 include the same material as that of the bonding members 30 at the outermost surface, the bonding strength between the second wiring parts 22 and the light emitting elements 40 can be further improved.

Figure 3:
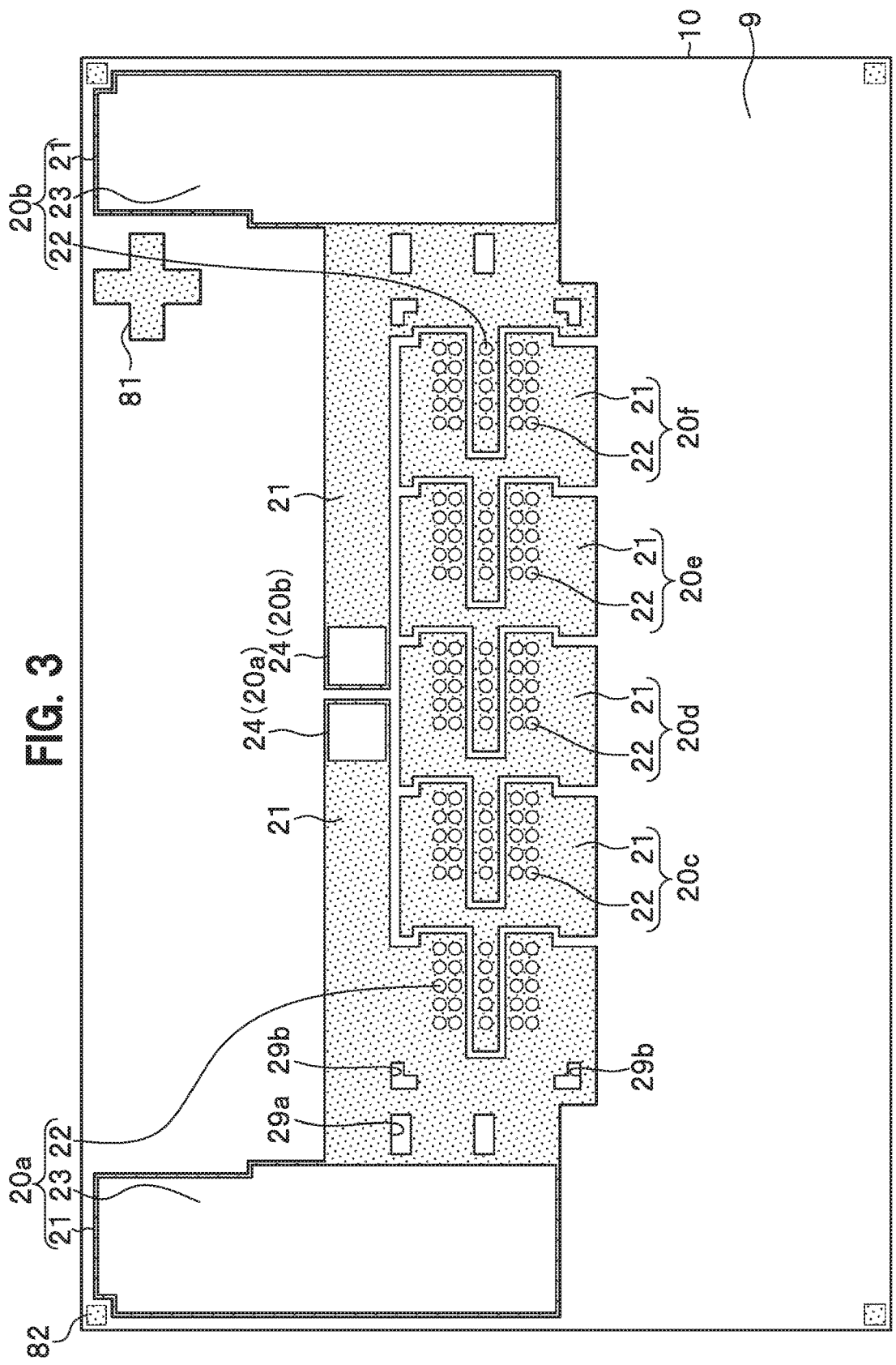
FIG. 3 is a schematic plan view showing an example of the mounting board in the light emitting device shown in FIG. 1.

The mounting board 10 includes a plurality of wiring structures 20 on the base part 9. The plurality of wiring structures 20 refer to, for example, a set of wiring structures 20a and 20b used as external electrodes for the light emitting device 1. As shown in FIG. 3, the mounting board 10 in the present embodiment includes, as the plurality of wiring structures 20, a set of wiring structures 20a and 20b, and four relay wiring structures 20c to 20f disposed between the set of wiring structures 20a and 20b. These wiring structures 20a to 20f each includes one of the first wiring parts 21 and one of the second wiring parts 22, and the light emitting elements 40 are connected on the second wiring parts 22. A portion of each of the set of wiring structures 20a and 20b can be used as an external connection part for the light emitting device 1. In the present embodiment, five pieces of light emitting elements 40 are connected in series straddling the wiring structures 20a to 20f.

Each wiring structure 20a and 20b has an extended portion that extends towards the outer edge of the mounting board 10. The extended portion is used as the external connection part for supplying electric current to the light emitting device 1 from the outside.

In the present embodiment, the wiring structures 20a and 20b each include a third wiring part 23 and a fourth wiring part 24 on the first wiring part 21 as described later. The third wiring parts 23 can be used as the external connection parts, and the fourth wiring parts 24 can be used as areas for mounting a protective device 70. The third wiring parts 23 and the fourth wiring parts 24 are each formed on the first wiring parts 21 spaced apart from the second wiring parts 22.

As described above, the wiring structures 20a to 20f each includes a first wiring part 21, a second wiring part 22 which has a smaller area than that of the first wiring part 21 disposed on the base part 9 side. The first wiring parts 21, the second wiring parts 22, the third wiring parts 23, and the fourth wiring parts 24 can be formed with a metal material, such as Cu, Al, Au, Ag, Pt, Ti, W, Pd, Fe, Ni, Rh, Ru, Mo, Cr, or the like, or an alloy containing one or more of these materials. The layering structure of each wiring part according to the present embodiment will be explained in detail below.

(i) First Wiring Part

The first wiring parts 21 have higher reflectance for the light emitted from the light emitting elements 40 than that of the bonding members 30. By having higher reflectance for the light emitted from the light emitting elements 40 than that of the bonding members 30, the first wiring parts 21 can efficiently reflect the light from the light emitting elements 40 that travels towards the mounting board 10.

Figure 5:
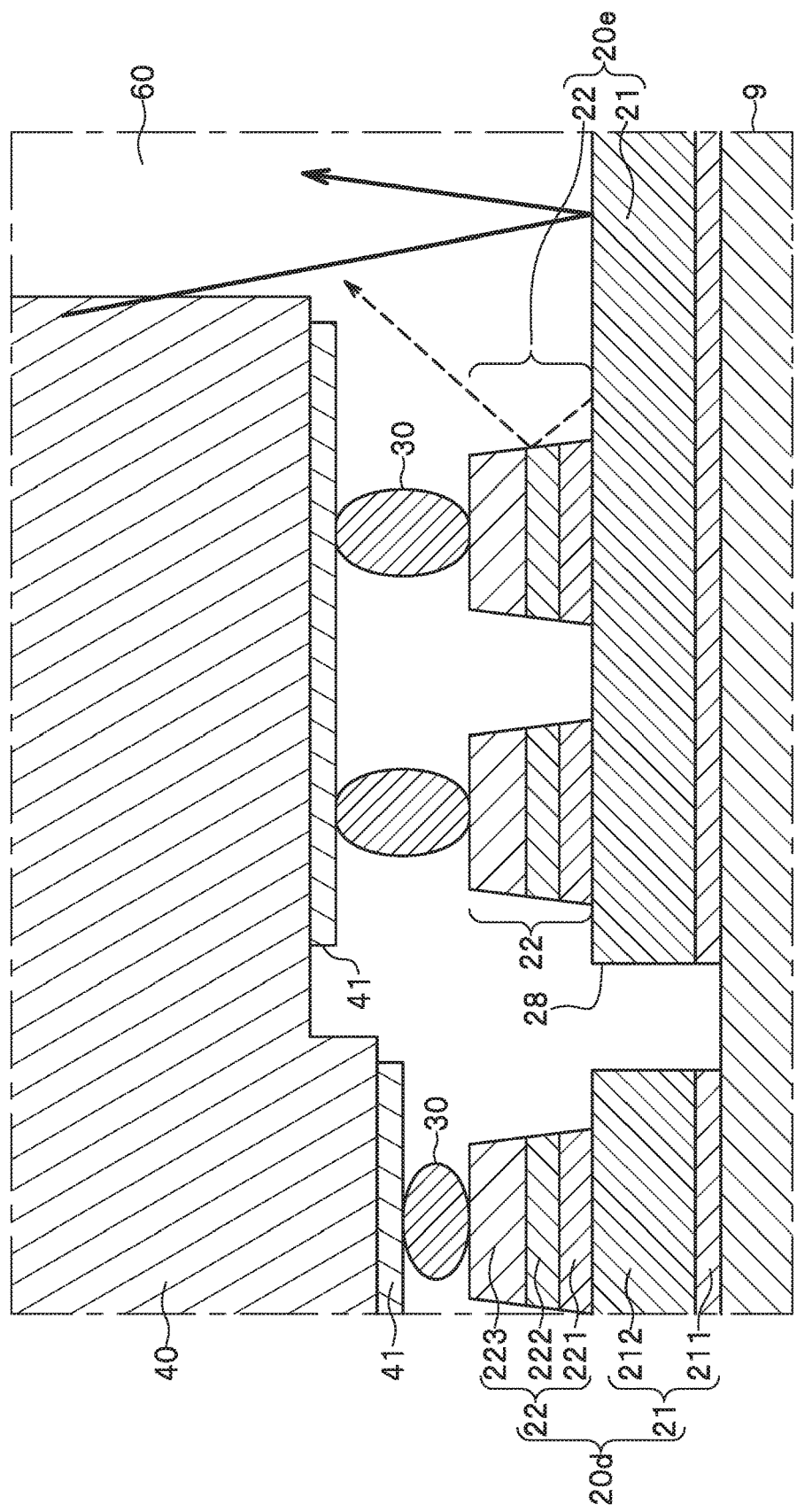
FIG. 5 is a cross-sectional view enlarging a portion of FIG. 4.

The first wiring parts 21 may be of a single layer structure of a material having higher reflectance that the bonding members 30, or may be of a multilayered structure composed of a plurality of layers as shown in FIG. 5. In the case of employing a multilayered structure for the first wiring parts 21, the light from a light emitting element 40 that travels towards the mounting board 10 can be efficiently reflected by configuring at least the layer disposed at the outermost surface of the first wiring parts 21 with a reflective layer having higher reflectance than the bonding members 30.

As shown in FIG. 5, the first wiring parts 21 have an adhesion layer 211 and a reflective layer 212 in that order from the base part 9 side.

The reflective layer 212 is disposed at the outermost surface of the first wiring parts 21. In the case of using Au for the bonding members 30 for example, the reflective layer 212 may be a single layer or multilayered structure using a metal selected from the group consisting of Al, Ag, Rh, Pt, Pd, and Ru, which have higher reflectance than that of Au, or an alloy containing at least one of these metals. In the present embodiment, the reflective layer 212 is configured with a single layer of Al, for example. The reflective layer 212, furthermore, can be adapted to function as a main conductor layer with reduced electrical resistance by being formed as a thick layer. The thickness of the reflective layer 212 in this case, considering the electrical resistance, is preferably in a range between about 2.5 μm to about 3.5 μm. For example, a thick Au conductor layer is disposed between the base part 9 and the adhesion layer 211, and alternatively, the reflective layer 212 can be thinner.

The adhesion layer 211 is a layer disposed between the base part 9 and the reflective layer 212 to enhance adhesion between the base part 9 and the reflective layer 212. Examples of the material used to form the adhesion layer 211 include Ti, W, Cr, Mo, Mn, the iron group elements (i.e., Fe, Co, and Ni), or the like. In the present embodiment, the adhesion layer 211 is formed with Ti as an example.

It is preferable to set the total thickness of the first wiring part 21 to at least 2.5 μm, considering the electrical resistance described above. It is also preferable to set the total thickness to about 10.0 μm at most considering the film forming time and the material costs.

(ii) Second Wiring Part

The second wiring parts 22 each contain the same material as that for the bonding members 30 at the outermost surface thereof. When the second wiring parts 22 contain the same material as that for the bonding members 30 at the outermost surface, the bondability between the bonding members 30 and the second wiring parts 22 can be improved. This can thus improve the bonding strength between the mounting board 10 and the light emitting element 40 which is connected thereto via the bonding member 30.

The second wiring parts 22 may be of a single layer structure using the same material as that for the bonding members 30, or of a multilayered structure as shown in FIG. 5. In the case of employing a multilayered structure for the second wiring parts 22, the bonding strength between the light emitting elements 40 and the mounting board 10 can be improved by providing the bonding layer made of the same material as the bonding members 30 as the layer disposed at each of the outermost surfaces of the second wiring parts 22.

As shown in FIG. 5, the second wiring parts 22 in the present embodiment each include an adhesion layer 221, an anti-diffusion layer 222, and a bonding layer 223 in that order from the first wiring part 21 side.

The bonding layer 223 is disposed at the outermost surface of each of the second wiring parts 22. The bonding layer 223 each includes a part that is directly bonded to a bonding member 30 which bonds to a light emitting element 40. A material having good bondability with the material for the bonding members 30 is used for the bonding layer 223. For example, if Au bumps are used as the bonding members 30, forming the bonding layer 223 as an Au layer or a layer containing Au can improve the bondability between the bonding members 30 and the bonding layer 223.

The anti-diffusion layer 222 is a layer disposed between the bonding layer 223 and the first wiring part 21. When the Au contained in the bonding layer 223, for example, and the Al contained in the reflective layer 212 are disposed in contact with one another, providing the anti-diffusion layer 222 between them can discourage or prevent the diffusion of Au and Al into one another. Examples of suitable materials for the anti-diffusion layer 222 include the platinum group elements (i.e., Pt, Pd, Ru, Rh, Os, and Ir) and their congeners, i.e., the iron group elements (i.e., Fe, Co, and Ni). In the present embodiment, the anti-diffusion layer 222 is configured with Pt by way of example.

The adhesion layer 221 is a layer disposed to enhance the adhesion between the reflective layer 212 and the anti-diffusion layer 222. The materials exemplified for the adhesion layer 211 of the first wiring parts 21 described above can be used for the adhesion layer 221. In the present embodiment, the adhesion layer 221 is configured with Ti by way of example. The adhesion layer 221 also has the function of discouraging or preventing Au from diffusing from the bonding layer 223 to the reflective layer 212.

Specific examples of the materials for the bonding members 30 include eutectic alloy films, for example, an alloy containing Au and Sn as the main components, Au and Si as the main components, Au and Ge as the main components, or Sn and Cu as the main components. In the present embodiment, the bonding members 30 and the bonding layer 223 are configured with Au by way of example.

Figure 4:
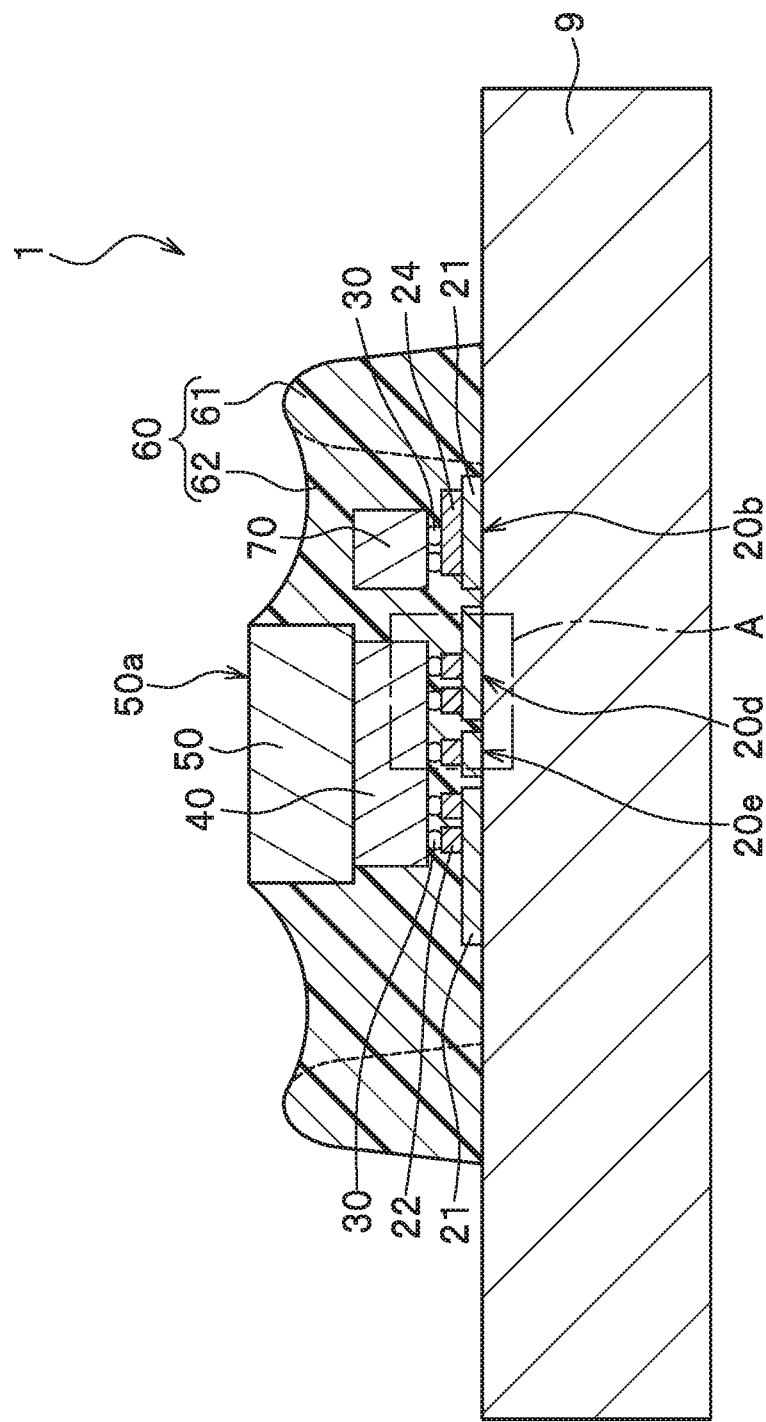
FIG. 4 is a schematic cross-sectional view showing the configuration of the light emitting device according to the embodiment, taken along line IV-IV in FIG. 2.

In the present embodiment, as shown in FIG. 3 and FIG. 4, the wiring structures 20a to 20f each have a plurality of second wiring parts 22 having a smaller area than that of one of the light emitting elements 40 mounted thereon. More specifically, the light emitting device 1 according to the present embodiment has the plurality of second wiring parts 22 in the areas directly under the light emitting elements 40. Because the first wiring parts 21 are exposed between the second wiring parts 22, the light from the light emitting elements 40 travelling towards the mounting board 10 can be efficiently reflected even in the areas directly under the light emitting elements 40.

As shown in FIG. 5, the second wiring parts 22 are formed such that their upper faces are smaller than the bottom faces thereof. In other words, the second wiring parts 22 are tapered to their upper ends. This makes it easier for a portion of the light emitted by the light emitting elements 40 and reflected by the first wiring parts 21 to be reflected by the lateral faces of the second wiring parts 22 as indicated by the broken arrow in FIG. 5, thereby facilitating the reflected light to be extracted in the upward direction.

On the first wiring part 21, each wiring structure 20 includes a plurality of second wiring parts 22 having smaller areas than the first wiring part 21. Each second wiring part 22 has a bonding layer 223 at the outermost surface made of a material which has bonding compatibility with a bonding member 30. In each wiring structure 20 the first wiring part 21 containing a material of higher reflectance than the second wiring part 22 is arranged in the surrounding of the second wiring parts 22. For this reason, the wiring structures 20 can maintain high bonding strength with the light emitting elements 40 while efficiently reflecting the light emitted from the light emitting elements 40 and traveling towards the mounting board 10. The second wiring parts 22 are preferably approximately circular or approximately elliptical in shape in a plan view. Because the bonding members 30 are usually approximately circular or approximately elliptical in shape in a plan view, it is preferable for the second wiring parts 22 to also be approximately circular or approximately elliptical in shape in a plan view. By having the same shape as area of each of the bonding members 30, the second wiring parts 22 that are connected to the bonding members 30 can have a reduced area of each of the second wiring parts 22, thereby increasing the exposed areas of the reflective layers 212. This can increase the light extraction efficiency.

The total film thickness of a second wiring part 22 is preferably at least 0.5 μm, more preferably at least 1.0 μm, considering the separation thereof due to the shock subjected to during the mounting of the light emitting elements. Moreover, the total film thickness is preferably about 10.0 μm at most, considering the film forming time and the materials costs.

(iii) Third Wiring Part

The third wiring parts 23 are formed on the extended areas of the first wiring parts 21 as the external connection parts exposed from the reflective member 60. The third wiring parts 23 preferably have, for example, a conductor film containing Au at their outermost surfaces. Here, in a plan view, the area of each third wiring part 23 is formed smaller than the area of the first wiring part 21 in the external connection portion, but the third wiring parts 23 may be formed in a larger area than the first wiring parts 21 in the connection area. In this case, for example, the first wiring part 21 in each external connection portion may be covered with the third wiring part 23 such that the first wiring part 21 is not exposed from the third wiring part 23.

(iv) Fourth Wiring Part

The fourth wiring parts 24 are formed on the first wiring parts 21 at the positions where the ends of the wiring structures 20a and 20b are opposed to one another. A protective device 70 can be connected to the fourth wiring parts 24. Here, each of the fourth wiring parts 24 is formed to a square shape in a plan view. Similar to the second wiring parts 22, the fourth wiring parts 24 preferably have a conductor film containing Au, for example, at the outer most surfaces in order to connect electronic components such as a protective device.

(v) Through Hole

In the present embodiment, moreover, the wiring structures 20a and 20b have through holes 29a and 29b where the surface of the base part 9 of the mounting board 10 is exposed. The through holes 29a and 29b can improve the adhesion between the mounting board 10 and the reflective member 60 described later, and can also be used as markings for recognizing the positions of the light transmissive member 50 and the light emitting elements 40 during the manufacturing process.

In addition to the wiring structures 20a to 20f, an anode marking 81 and position markings 82 are formed on the mounting board 10 independent from the wiring used to supply power.

Light Emitting Element

In the present embodiment, five light emitting elements 40 are mounted on the base part 9. Each light emitting element 40 includes external connection electrodes 41 on the same surface as a set of positive and negative electrodes. Each light emitting element 40 is flip-chip mounted such that the set of electrodes bonded to the second wiring parts 22 via the bonding members 30 made of Au or the like, and uses its upper face opposite the lower face where the electrodes are formed as the main emission face. The external connection electrodes 41 of each light emitting element 40 are bonded to plural second wiring parts 22 via plural bonding members 30. In the present embodiment, the plural bonding members 30 are individually bonded to the plural second wiring parts 22.

It is preferable for the set of positive and negative electrodes of the light emitting element 40 to have Au at outermost surface. Au is chemically stable and can ensure the electrical connection reliability of the light emitting device over an extended period of time. Furthermore, even higher connection reliability can be achieved by forming the outermost surfaces of both the bonding members 30 and the second wiring parts 22 with an Au-containing layer.

It is preferable to use a light emitting diode for the light emitting element 40. For the light emitting element 40, one having any emission wavelength can be selected. Examples of a blue or green light emitting element 40 include those employing ZnSe or nitride-based semiconductors ($In_XA l_YGa_{1-X-Y}N$, $0 \leq X$, $0 \leq Y$, $X+Y \leq 1$), and examples of a red light emitting element 40 include those employing GaAlAs or AlInGaP. Moreover, semiconductor light emitting elements composed of materials other than those can also be used. The compositions, emission colors, sizes, and the number of the light emitting elements 40 to be used can be suitably selected in accordance with the purpose.

Light Transmissive Member

In the present embodiment, the light emitting device 1 includes a light transmissive member 50 bonded on the upper faces of the light emitting elements 40, as shown in FIG. 1 and FIG. 4. The light transmissive member 50 is a member that covers the upper surfaces of the light emitting elements 40. The light transmissive member 50 is of a sheet form, and is formed to have an approximately rectangular shape in a plan view.

The light transmissive member 50 has a lower face on which the light from the light emitting elements 40 is incident, and an upper face 50a which is the light emission face of the light emitting device 1 emitting the light from the light emitting elements 40.

The light transmissive member 50 is configured with a material that is capable of transmitting and externally releasing the light emitted from the light emitting elements 40. The light transmissive member 50 may contain a light diffusing agent, and a phosphor which can convert the wavelength of at least a portion of the light from the light emitting elements 40. Examples of a phosphor-containing light transmissive member 50 include a sintered body of a phosphor, and those made of resins, glass, or other inorganic materials which contain a phosphor powder.

For the phosphors to be contained in the light transmissive member 50, any phosphor used in the art can be suitably selected. Examples of phosphors excitable by light emitted from a blue light emitting element or an ultraviolet light emitting element include cerium-activated yttrium aluminum garnet-based phosphors (e.g., $Y_3(Al,Ga)_5O_{12}$:Ce); cerium-activated lutetium aluminum garnet-based phosphors (e.g., $Lu_3(Al,Ga)_5O_{12}$:Ce); europium- and/or chromium-activated nitrogen-containing calcium aluminosilicate-based phosphors (e.g., $CaO-Al_2O_3-SiO_2$:Eu); europium-activated silicate-based phosphors (e.g., $(Sr,Ba)_2SiO_4$:Eu); nitride-based phosphors, such as β-SiAlON phosphors, CASN-based phosphors (e.g., $CaAlSiN_3$:Eu), and SCASN-based phosphors (e.g., $(Sr,Ca)AlSiN_3$:Eu); manganese-activated potassium fluorosilicate-based phosphors (e.g., $K_2SiF_6$:Mn); sulfide-based phosphors; and quantum dot phosphors. By combining one or more phosphors with a blue or ultraviolet light emitting element, desired emission color of light emitting devices (e.g., a white light emitting device) can be produced. In the case of producing a light emitting device 1 capable of emitting white light, the type and the concentration of the phosphor contained in the light transmissive member 50 are adjusted to make the emission color white. The concentration of the phosphor, for example, is about 5 mass % to about 50 mass %.

For the light diffusing agent that can be contained in the light transmissive member 50, for example, titanium oxide, barium titanate, aluminum oxide, silicon oxide, or the like can be used.

Reflective Member

The reflective member 60 covers at least a portion of the bonding member 30 and at least a portion of the wiring structures 20. In the present embodiment, the reflective member 60 is disposed between the light emitting elements 40 and the wiring structures 20. The reflective member 60 is also provided in the surrounding of the light transmissive member 50 formed in the shape of a rectangular annulus in a plan view. The reflective member 60 exposes the upper face of the light transmissive member 50 while covering the other surfaces of the light transmissive member 50 and the lateral faces of the light emitting elements 40.

The reflective member 60 can be formed by having a reflective substance contained in a resin member made of a silicone resin, modified silicone resin, epoxy resin, modified epoxy resin, acrylic resin, a resin or a hybrid resin containing at least one of these resins. For the reflective substance, an oxide containing any of Ti, Zr, Nb, Al, and Si, or AlN, MgF, BN, or the like can be used. Alternatively, particles having a different refractive index than that of the base material can be dispersed as the reflective substance in the base material. The content, concentration, and the density of the reflective substance can be suitably adjusted depending on the shape and size of the light emitting device 1. The reflective substance content in the reflective member 60, for example, is preferably in the range of from 20 to 60 parts by weight for 100 parts of the resin material.

In the case of using a resin material for the reflective member 60, the light emitting device 1 may have a frame part 61 to retain the resin member. The frame part 61 can be formed, for example, with a ceramic, resin, or the like. In the present embodiment, both the frame part 61 and the filling part 62 are formed with a resin material containing a reflective substance, and the frame part 61 and the filling part 62 integrally form the reflective member 60.

Figure 8:
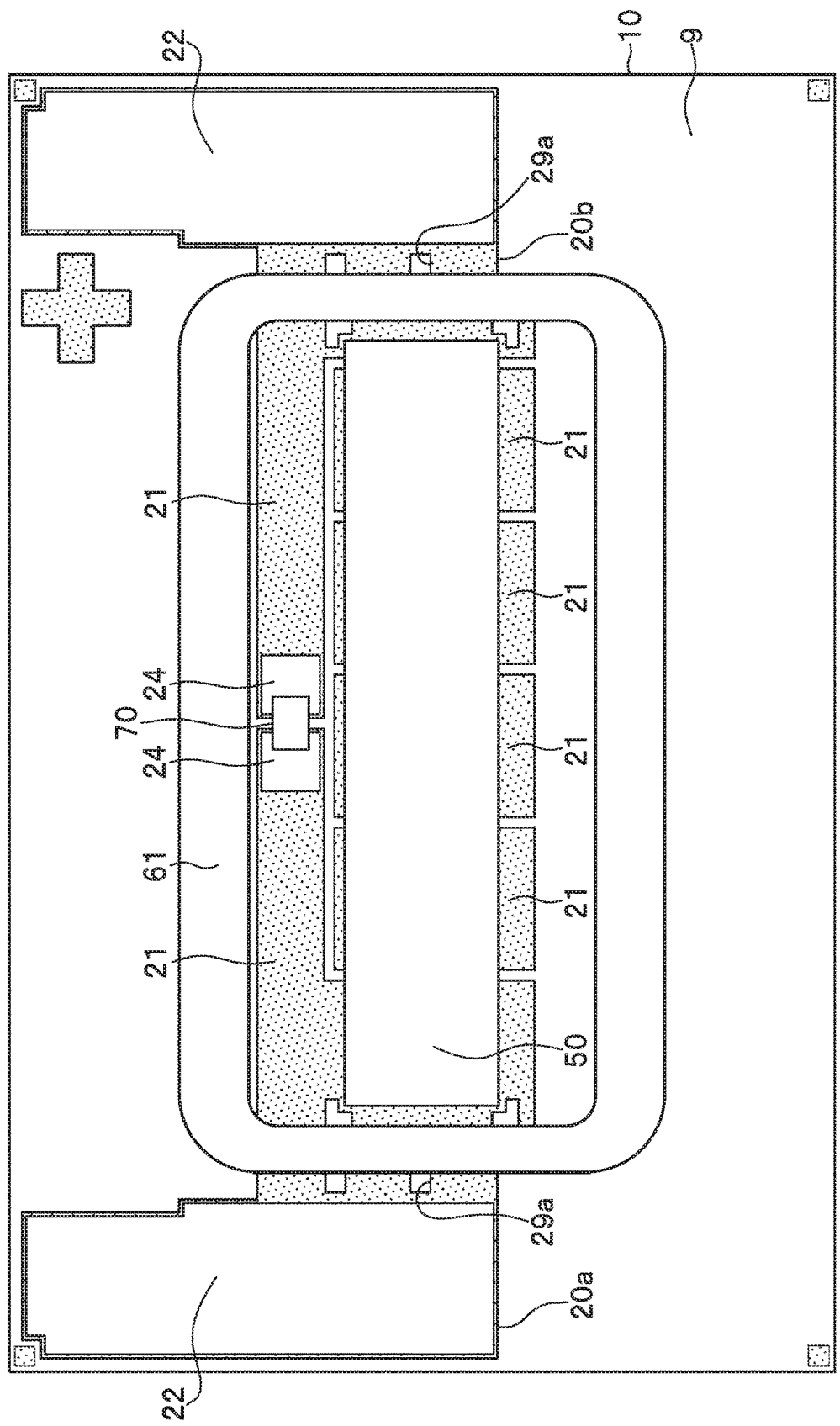
FIG. 8 is a schematic plan view showing a step of forming a frame part of the reflective member in the method for manufacturing the light emitting device according to the embodiment.

The frame part 61 is disposed on the mounting board 10 spaced apart from the light transmissive member 50 so as to surround the light transmissive member 50. In the present embodiment, as shown in FIG. 8, the frame part 61 is formed as a rectangular annulus in a plan view where the short sides of the frame part 61 parallel the short sides of the light transmissive member 50 and the long sides of the frame part 61 parallel the long sides of the light transmissive member 50.

The filling part 62 is disposed between the frame part 61 and the light transmissive member 50, and between the frame part 61 and the light emitting elements 40, covering the lateral faces of the light transmissive member 50 and the lateral faces of the light emitting elements 40.

Other Components

The light emitting device 1 according to the present embodiment may include a protective device 70, such as a Zener diode. The protective device 70 disposed on the fourth wiring parts 24 is embedded in the reflective member 60.

Operation of the Light Emitting Device

The operation of the light emitting device will be explained.

The light emitting device 1 is such that the light emitting elements 40 emit light when electric current is supplied to the light emitting elements 40 from an external power supply via the wiring structures 20. The light emitted from the upper faces of the light emitting elements 40 enters the light transmissive member 50 from the lower face thereof, and exiting from the upper face 50a of the light transmissive member 50. The light exiting from the lateral faces of the light emitting elements 40 is reflected by the reflective member 60 at the interfaces between the light emitting elements 40 and the reflective member 60, and at the interfaces between the light transmissive member 50 and the reflective member 60, into the light emitting elements 40 and the light transmissive member 50. In this manner, the light propagates in the light emitting elements 40 and the light transmissive member 50 to ultimately be exiting from the upper face 50a of the light transmissive member 50, which serves as the light emission face of the light emitting device 1.

The light emitting device 1 is equipped with the reflective member 60 even between the light emitting elements 40 and the mounting board 10, i.e., the area immediately under the light emitting elements 40. For this reason, the light propagating downward in the light emitting element 40 is reflected upward by the external connection electrodes 41 and the reflective member 60 to exit from the upper faces of the light emitting elements 40.

A portion of the light exiting downward from the light emitting elements 40, however, might occasionally reach the surface of the mounting board 10 after transmitting through the reflective member 60. When the distance between the light emitting elements 40 and the mounting board 10 is short, in particular, the thickness of the reflective member 60 filling between them can be small, which makes it difficult to reflect all of the light that is traveling downward.

Because the light emitting device 1 according to the present embodiment is provided with the first wiring parts 21 made of Al or the like which has high reflectance at the outermost surface of the mounting board 10 in the area immediately under the light emitting elements 40, the light having reached the surface of the mounting board 10 is reflected by the first wiring parts 21 and exiting upwardly as shown by the arrow in FIG. 5. Accordingly, it can reduce the absorption of light by the surface of the mounting board 10, thereby achieving a higher light extraction efficiency.

In the light emitting device 1 according to the present embodiment, moreover, the second wiring parts 22 bonded to the light emitting elements 40 via the bonding members 30 are positioned higher than the first wiring parts 21 in the wiring structures 20 of the mounting board 10. For this reason, the distance between the light emitting elements 40 and the first wiring parts 21 is larger by the amount equivalent to the thickness of the second wiring parts 22. This can increase the thickness of the reflective member 60 disposed between the light emitting elements 40 and the first wiring parts 21, thereby increasing the amount of light that can be reflected by the reflective member 60.

Method for Manufacturing the Light Emitting Device

A method for manufacturing the light emitting device according to the present embodiment will be explained. The method for manufacturing the light emitting device 1 according to the present embodiment primarily has a mounting board preparation step, a light emitting element mounting step, and a reflective member forming step, which are performed in that order. The materials used for and the arrangements of the members are as described earlier in the explanation of the light emitting device 1, and thus the explanations will be omitted here when appropriate.

Mounting Board Providing Step

The mounting board preparation step is a step to prepare a mounting board 10 in which wiring structures 20 are formed on a base part 9. In this embodiment, as shown in FIG. 3 to FIG. 5, a mounting board 10 is provided which has a larger number of second wiring parts 22 than the number of the external connection electrodes 41 of the light emitting elements 40 formed in the areas directly under the light emitting elements 40.

The wiring structures 20 can be formed by using a known method in the art. For example, the conductor film that form the first wiring parts 21 and the second wiring parts 22 can be formed by vapor deposition, sputtering, electroplating, electroless plating, or the like. The film can be processed to predetermined electrode shapes by etching, lift-off, or the like by using a mask formed by photolithography, printing, or the like.

Light Emitting Element Mounting Step

The light emitting element mounting step is a step of flip-chip mounting light emitting elements 40 on the second wiring parts 22 via bonding members 30. More specifically, the light emitting element mounting step includes a bonding member forming step and a light emitting element bonding step.

Bonding Member Forming Step

The bonding member forming step is a step of forming a plurality of bonding members 30 on the electrode surfaces of the light emitting elements 40. It is preferable to form bumps for the bonding members 30. Any known conventional bumps, for example, plated bumps or stud bumps, can be used.

For the bumps, Au alone, or a stack structure made of a Cu or Ni as the base and an Au surface layer, is used. In the case of a stack structure, Pd or the like is used as a barrier layer. A eutectic material, such as Au—Sn or the like, may occasionally be formed on the surface for a reflow process.

Light Emitting Element Bonding Step

Figure 6:
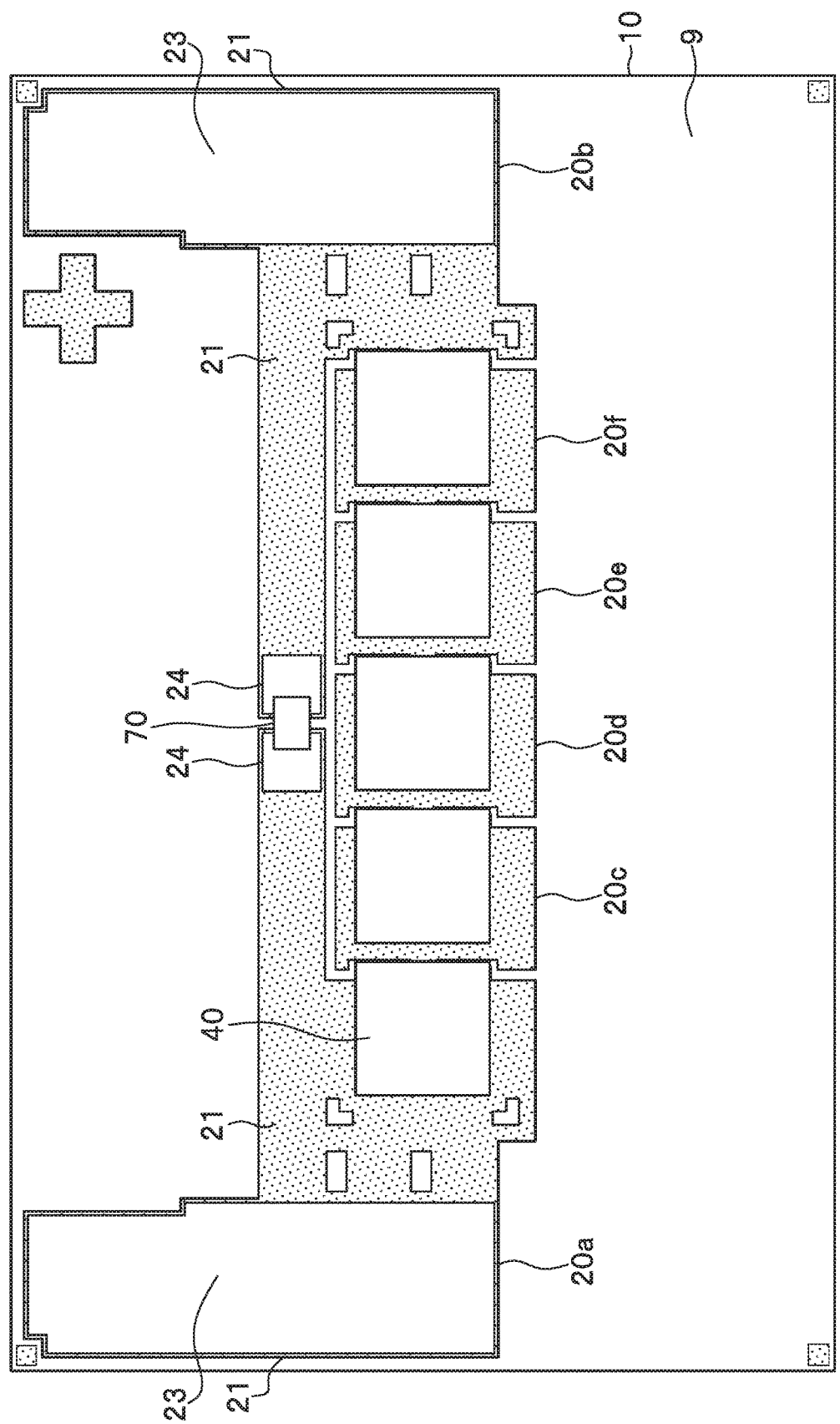
FIG. 6 is a schematic plan view showing a light emitting element bonding step in a method for manufacturing the light emitting device according to the embodiment.

The light emitting element bonding step is a step to align the bonding members 30 formed on the electrode surfaces of the light emitting elements 40 with the second wiring parts 22 on the mounting board 10, and to bond the bonding members 30 formed on the electrode surfaces to the second wiring parts 22 by vibrating the light emitting elements 40 using ultrasonic waves. In this manner, the light emitting elements 40 can be flip-chip mounted as shown in FIG. 6. The five light emitting elements 40 are arranged in a row, and connected in series on the mounting board 10 using the wiring structures 20a, 20c, 20d, 20e, 20f, and 20b described earlier. In the case of mounting a plurality of light emitting elements 40, it is preferable to orderly arrange the light emitting elements 40 to be mounted such that they form a substantially rectangular shape as a whole in a plan view. Similarly, the protective device 70 can be mounted on the fourth wiring parts 24 using the bonding members 30.

Light Transmissive Member Bonding Step

The method for manufacturing the light emitting device according to this embodiment includes a light transmissive member bonding step prior to the step of forming the reflective member 60.

Figure 7:
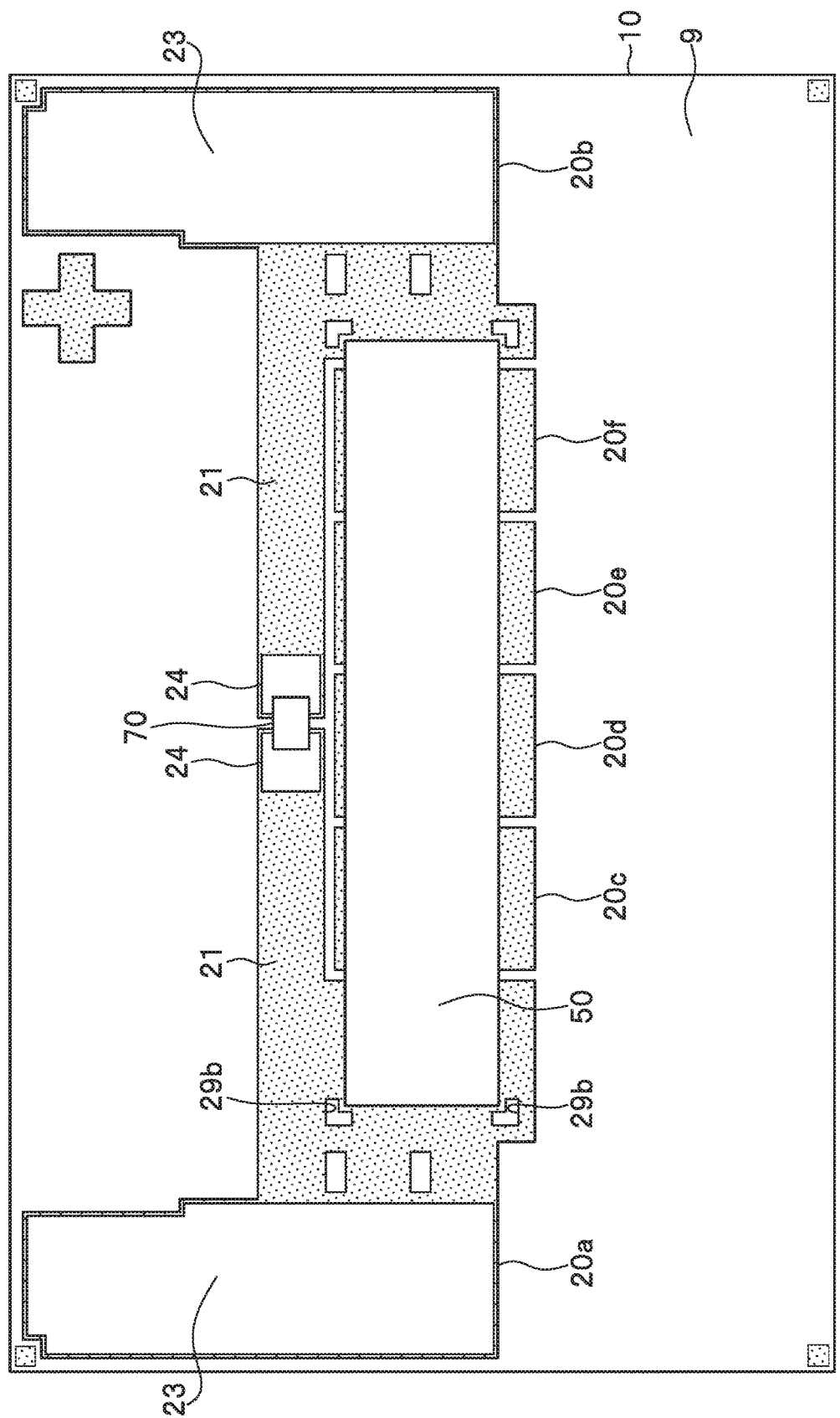
FIG. 7 is a schematic plan view showing a light transmissive member bonding step in the method for manufacturing the light emitting device according to the embodiment.

The light transmissive member bonding step is a step of bonding the light transmissive member 50 to the upper faces of the light emitting elements 40 which have been mounted on the mounting board 10. In the present embodiment, as shown in FIG. 7, a plate-like light transmissive member 50 substantially rectangular in a plan view is joined to the upper faces of the light emitting elements 40. The light emitting elements 40 and the light transmissive member 50 can be joined via an adhesive material. Alternatively, the light emitting elements 40 and the light transmissive member 50 can be directly joined together by way of pressure bonding, sintering, surface activated bonding, atomic diffusion bonding, or hydroxyl group bonding.

Reflective Member Forming Step

The reflective member forming step is a step of covering the bonding members 30 and the wiring structures 20 with a reflective member 60. In this embodiment, the reflective member 60 is formed between the light emitting elements 40 and the first wiring parts 21. In addition, the reflective member 60 is formed to a rectangle with rounded corners in a plan view so as to expose the upper face 50a of the light transmissive member 50 while covering the lateral faces of both the light emitting elements 40 and the light transmissive member 50. More specifically, the reflective member forming step includes a frame part forming step and a filling part forming step.

Frame Part Forming Step

The frame part forming step is a step of forming a frame part 61 which surrounds the light transmissive member 50.

As shown in FIG. 8, in the frame part forming step, a frame part 61 is formed to retain the reflective member. By forming the frame part 61 in advance, the filling part discussed later, having a predetermined shape can be formed. Such a frame part 61 can be formed by using, for example, a resin discharge apparatus capable of continuously discharging a liquid resin utilizing air pressure (see Japanese Unexamined Patent Application Publication No. 2009-182307). Alternatively, a frame made of a molded resin or ceramic can be bonded by using a resin material. When using a resin material during the formation of the frame part 61, however, a resin component might occasionally seep out from the resin material.

As shown in FIG. 1, however, the light emitting device 1 according to the present embodiment has the third wiring parts 23, which are the external connection parts to be connected to an external power supply, are formed above the first wiring parts 21 that surround them. Accordingly, by providing the height difference between the first wiring parts 21 and the third wiring parts 23, the resin component seeping out from the frame part 61 is less likely to creep up onto the upper face of the third wiring parts 23 to thereby reduce contamination of the surfaces of the third wiring parts 23.

Filling Part Forming Step

The filling part forming step is a step of disposing a filling part 62 between the frame part 61 and the light transmissive member 50 in such a manner as to cover the lateral faces of the light transmissive member 50.

Figure 9:
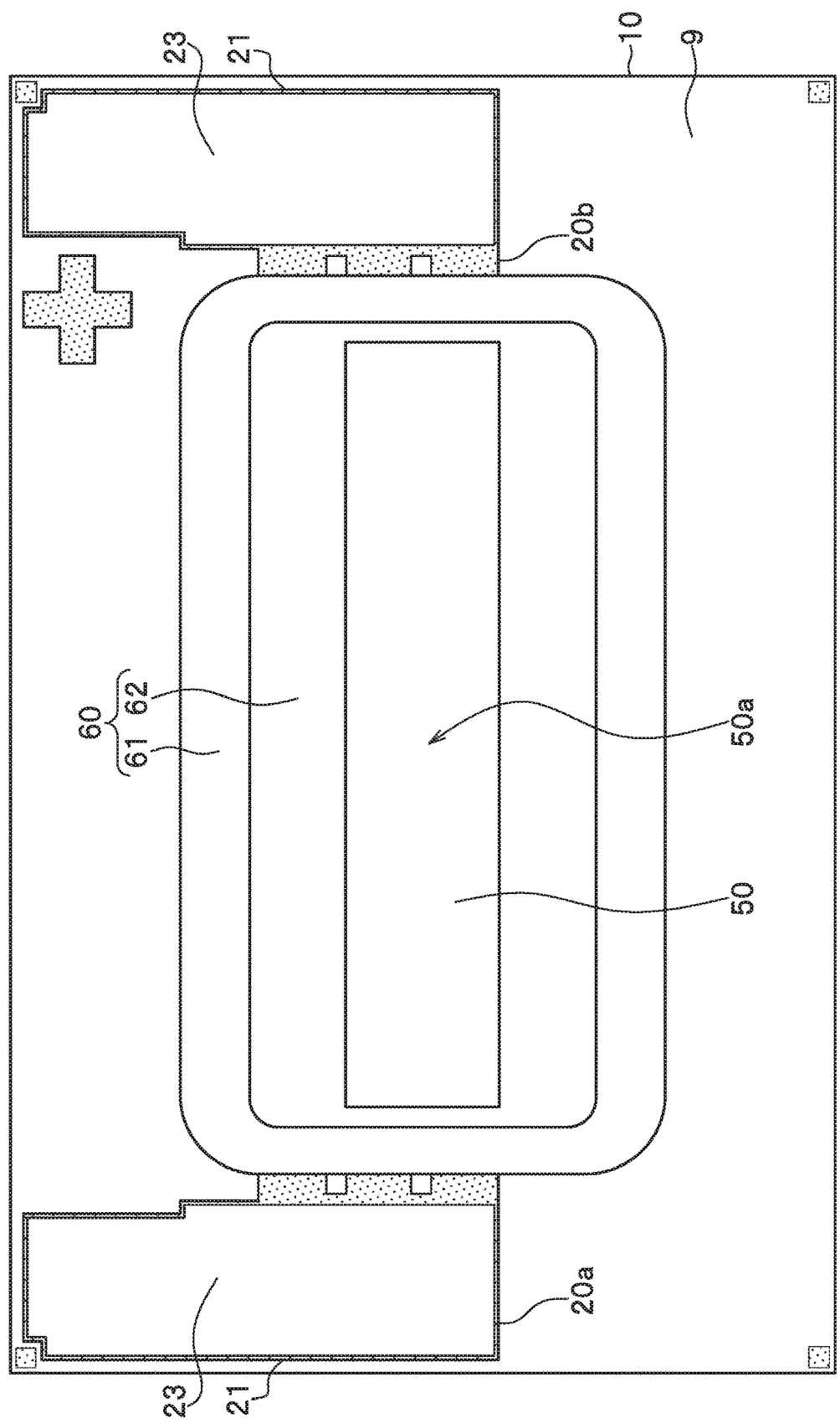
FIG. 9 is a schematic plan view showing a step of forming a filling part of the reflective member in the method for manufacturing the light emitting device according to the embodiment.

As shown in FIG. 9, the inside of the frame part 61 is filled with the filling part 62, which is a reflective material, for example, a resin containing a reflective substance. In the present embodiment, the filling part 62 covers the lateral faces of both the light emitting elements 40 and the light transmissive member 50 while the upper face 50a of the light transmissive member 50 exposed from the filling part 62 serves as the emission face. The filling part 62, moreover, is formed such that the height of the upper face (i.e., upper end) thereof from the base part 9 is equal to or lower than the height of the upper face 50a of the light transmissive member 50.

The filling amount of the resin used for the filling part 62 is adjusted to the extent that the resin cover the lateral faces of the light emitting elements 40 and the light transmissive member 50. Although it depends on the surface condition of each member and the viscosity of the resin, the height of the filling part 62 should be, for example, one half or more of the height of the upper face 50a of the light transmissive member 50 from the surface of the base part 9 or higher. In order to discourage or prevent leakage of light, it is preferable to form the reflective member 60 with a large thickness, particularly at the lateral faces of the light emitting elements 40, which are the emission sources. For example, the thickness of the reflective member 60 at the lateral faces of the light emitting elements 40 is preferably at least 400 µm. For this purpose, it is preferable to adjust the filling amount of the resin for the filling part 62 by forming the frame part 61 higher than at least the upper faces of the light emitting elements 40 such that the lowest surface of the filling part 62 is higher than the upper faces of the light emitting elements 40.

Moreover, in order to discourage or prevent the protective device 70 from absorbing light, the protective device 70 is preferably completely covered by the reflective member 60. Furthermore, the frame part 61 and the filling part 62 are preferably formed to cover the vicinities of the light emitting elements 40, and the protective device 70, areas where an end of the wiring structure 20a and an end of the wiring structure 20b face one another, which can discourage or prevent shorting caused by dust or the like.

As part of the reflective member 60, an underfill material may be disposed other than the filling part 62. The underfill material is disposed primarily between the mounting board 10 and the light emitting elements 40. Preferably, a reflective material, for example, a resin containing a reflective substance having better flowability, in other words, having a lower viscosity than the filling part 62 is used. When provided, an underfill material can absorb stress attributable to the difference in the thermal expansion coefficients between the light emitting elements 40 and the base part 9, as well as improving the heat dissipation properties. An underfill material having reflective properties can reflect the light from the light emitting elements 40 traveling towards the mounting board 10 as described earlier, thereby increasing the light extraction efficiency of the light emitting device.

Second Embodiment

Figure 10:
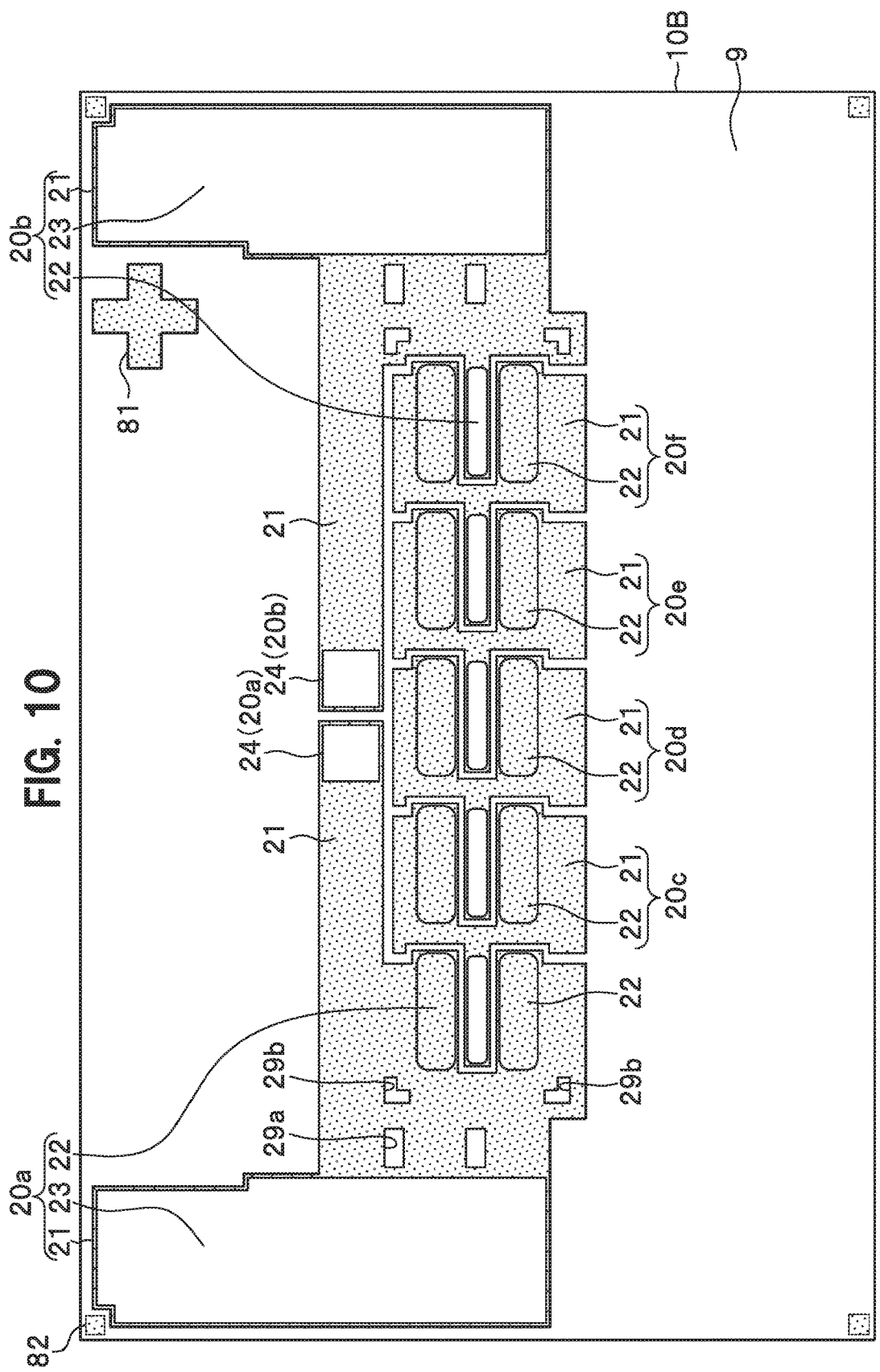
FIG. 10 is a schematic plan view showing a mounting board of the light emitting device according to a second embodiment.
Figure 11:
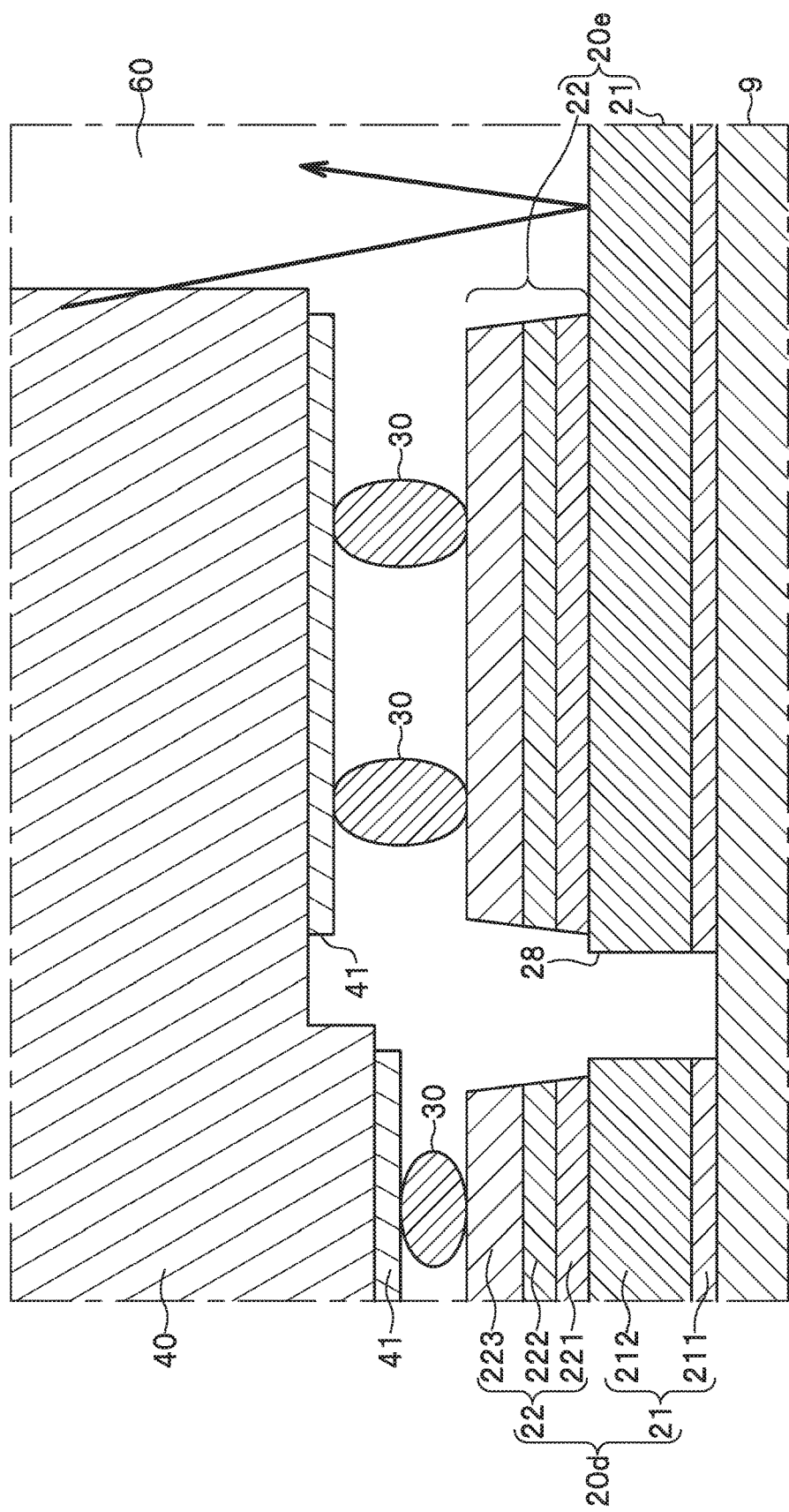
FIG. 11 is a cross-sectional view enlarging a portion of the light emitting device according to the second embodiment.

A light emitting device according to the second embodiment will be explained with reference to FIG. 10 and FIG. 11.

The light emitting device according to this embodiment differs from the light emitting device 1 according to the first embodiment in terms of the shape of the second wiring parts 22. In the following explanation, the same components as those in the light emitting device 1 according to the first embodiment are denoted by the same reference numerals, for which the descriptions are omitted. FIG. 11 is a schematic cross-sectional view of the light emitting device according to the second embodiment which corresponds to FIG. 5. In other words, FIG. 11 shows an enlarged portion of the cross section taken along line IV-IV in FIG. 2.

The light emitting device according to this embodiment differs from the light emitting device according to the first embodiment in that each of the second wiring parts 22 on the mounting board 10B has a shape in which the length in one direction is longer than the direction perpendicular thereto in a plan view, and a plurality of bonding members 30 are bonded to each of the second wiring parts 22. Here, the direction of the longer side is the direction of ultrasonic vibration applied during flip-chip mounting the light emitting elements 40 on the second wiring parts 22. Imperfection of bonding attributable to misalignments caused by ultrasonic vibration can be reduced by providing the second wiring parts 22 having a shape extending in the direction of vibration.

The light emitting devices and the method for manufacturing the same according to the present disclosure have been specifically explained based on the embodiments to practice the present invention, but the scope of the present invention is not limited to those described above and should be construed broadly based on the scope of claims. In addition, various modifications and variations made based on the above descriptions are also included in the scope of the present invention, as a matter of course.

For example, the number of light emitting elements 40 mounted on the mounting board 10 can be varied so long as there are one or more. The number can be suitably changed in accordance with a desired size of the light emitting device 1 and the required luminance. Moreover, the shapes, arrangement and the number of the wiring structures 20 (20a to 20f) can be suitably changed so long as the positional or areal relationship between the first wiring parts 21 and the second wiring parts 22 is maintained, and they provide a wiring pattern capable of mounting the light emitting elements 40.

What is claimed is:

1. A light emitting device comprising:
   a mounting board comprising:
      a base part, and
      one or more wiring structures, each of which includes:
         one or more first wiring layers located on an upper surface of the base part, and
         one or more second wiring layers located on an upper surface of the one or more first wiring layers,
      wherein a lower surface of the one or more second wiring layers contacts an upper surface of the one or more first wiring layers,
      wherein, in a plan view, an area of each of the one or more second wiring layers is smaller than an area of each of the one or more first wiring layers;
   one or more light emitting elements bonded to the second wiring layers via bonding members; and
   a reflective member covering at least a portion of the bonding members and at least a portion of the one or more wiring structures,
   wherein a reflectance of the one or more first wiring layers is higher than a reflectance of the bonding members,
   wherein the one or more second wiring layers and the bonding members comprise the same material at their outermost surfaces,
   wherein one or more outermost surfaces of the one or more first wiring layers comprise a metal selected from the group consisting of Al, Ag, Rh, Pt, Pd, and Ru, and an alloy containing at least one of these metals.

2. The light emitting device according to claim 1, wherein, in a plan view, an area of each of the one or more second wiring layers is smaller than an area of one of the light emitting elements.

3. The light emitting device according to claim 1, wherein the plurality of second wiring layers are located in an area directly under the one or more light emitting elements.

4. The light emitting device according to claim 1, wherein the one or more second wiring layers comprise Au at one or more outermost surfaces thereof.

5. The light emitting device according to claim 1, wherein each of the second wiring layers has a circular or elliptical shape in a plan view.

6. The light emitting device according to claim 1, wherein an area of an upper face of each of the one or more second wiring layers is smaller than an area of a lower face of each of the one or more second wiring layers.

7. The light emitting device according to claim 1, wherein each of the one or more wiring structures includes one or more third wiring layers, each of the one or more third wiring layers serving as an external connection layer exposed from the reflective member, each of the one or more first wiring layers has an extended area exposed from the reflective member, and each of the one or more third wiring layers is located on a respective one of the extended areas of the one or more first wiring layers.

8. The light emitting device according to claim 1 further comprising:
   a light transmissive member joined to an upper face of each of the one or more light emitting elements.

9. The light emitting device according to claim 8, wherein the light transmissive member contains at least one phosphor.

10. The light emitting device according to claim 1, wherein a thickness of each of the one or more first wiring layers is in a range of from 2.5 μm to 10.0 μm.

11. The light emitting device according to claim 1, wherein a thickness of each of the one or more second wiring layers is in a range of from 0.5 μm to 10.0 μm.

* * * * *